US010536767B2

(12) United States Patent
Apgar et al.

(10) Patent No.: US 10,536,767 B2
(45) Date of Patent: Jan. 14, 2020

(54) HEAT POWERED EARPHONES

(71) Applicant: TCT Mobile (US) Inc., Irvine, CA (US)

(72) Inventors: Jeffrey Allen Apgar, Irvine, CA (US); Seung Jin Choi, Irvine, CA (US)

(73) Assignee: TCT Mobile (US) Inc., Irvine, CA (US)

( * ) Notice: Subject to any disclaimer, the term of this patent is extended or adjusted under 35 U.S.C. 154(b) by 0 days.

(21) Appl. No.: 15/874,112

(22) Filed: Jan. 18, 2018

(65) Prior Publication Data

US 2018/0206024 A1  Jul. 19, 2018

Related U.S. Application Data

(60) Provisional application No. 62/448,378, filed on Jan. 19, 2017.

(51) Int. Cl.
| *H04R 25/00* | (2006.01) |
| *H04R 1/10* | (2006.01) |
| *H04R 5/04* | (2006.01) |
| *H04R 1/02* | (2006.01) |
| *H01L 35/02* | (2006.01) |
| *H01L 35/30* | (2006.01) |

(52) U.S. Cl.
CPC ........... *H04R 1/1041* (2013.01); *H01L 35/02* (2013.01); *H01L 35/30* (2013.01); *H04R 1/02* (2013.01); *H04R 1/1016* (2013.01); *H04R 1/1091* (2013.01); *H04R 5/04* (2013.01); *H04R 2420/07* (2013.01); *H04R 2460/15* (2013.01)

(58) Field of Classification Search
CPC ...... H04R 1/1041; H04R 1/02; H04R 1/1016; H04R 1/1091; H04R 5/04; H01L 35/02; H01L 35/30
USPC .......................................... 381/164; 455/573
See application file for complete search history.

(56) References Cited

U.S. PATENT DOCUMENTS

| 8,160,655 | B2 * | 4/2012 | Kroll | H02J 7/025 |
| | | | | 455/573 |
| 8,340,731 | B2 * | 12/2012 | Kroll | H02J 7/025 |
| | | | | 455/573 |
| 2008/0168775 | A1 * | 7/2008 | Windheim | F25B 21/02 |
| | | | | 62/3.7 |
| 2009/0209303 | A1 * | 8/2009 | Kroll | H02J 7/025 |
| | | | | 455/575.2 |
| 2012/0077553 | A1 * | 3/2012 | Kroll | H02J 7/025 |
| | | | | 455/573 |

(Continued)

*Primary Examiner* — Phylesha Dabney

(57) ABSTRACT

A heat energy powered earphone is provided, which utilizes a thermoelectric (TE) module that is connected to an external heat exchanger clip. The clip can be affixed to a cool location such as the top of an ear, a hat, or other piece of clothing. The clip may connect to the TE module via a simple heat pipe. By using the clip, the earphone housing may be manufactured with a compact form factor that enables close insertion to the inner ear. Additionally, by providing an open hole in the TE module, audio waves can pass through unobstructed. Power management, wireless transmission, and audio playback circuitry may be provided via a tethered wire to an external electronics module. Interfacing methods are also provided, including a method for automatic pairing with an audio source upon insertion of the earphone, and a method for adjusting a fit of the earphone using audio feedback.

14 Claims, 3 Drawing Sheets

(56) References Cited

U.S. PATENT DOCUMENTS

2013/0109440 A1* 5/2013 Kroll ..................... H02J 7/025
                                                          455/569.1

* cited by examiner

HEAT POWERED EARPHONES

TECHNICAL FIELD

The present disclosure relates generally to wearable devices. More particularly, the present disclosure relates to heat energy powered earphones, and methods for interfacing with heat energy powered earphones.

BACKGROUND

Wireless earphones are becoming the preferred device for private personal listening. The lack of an interconnecting cord is more convenient for the user and promotes mobility, which is particularly useful for exercise, travel, commuting, and other on-the-go situations. Additionally, real estate on the playback device for the audio port and associated electronics such as a digital analog converter (DAC) can be omitted, enabling optimized form factors for smartphones, portable game systems, tablets, and other devices.

Wireless earphones typically rely on battery power as a sole energy source. This requires the user to periodically charge the earphone, which adds yet another device that the user must remember to keep charged. Further, the battery may add significant bulk and weight to the construction of the earphone.

Heat powered or thermoelectric powered earphones are known in the art, which utilize body heat as a primary or secondary power source. In this manner, many of the problems associated with battery powered earphones may be avoided. However, existing heat powered earphones utilize construction techniques that still result in a large form factor and have detrimental side effects to sound quality.

Accordingly, there is a need for a earphone that overcomes the shortcomings of the existing art.

SUMMARY

In one aspect of the present invention, an earphone system comprises a housing containing a speaker and a thermoelectric element, wherein the thermoelectric element includes a hole; a clip that is connected to the thermoelectric element via a heat pipe; and an electronics module that utilizes power provided by the thermoelectric element to playback, on the speaker, audio retrieved from a wireless transmission; wherein the clip, the heat pipe, and the electronics module is external to the housing.

In another aspect of the present invention, an earphone system comprises a speaker; and a thermoelectric element that provides current to power the speaker; wherein the speaker and the thermoelectric element are configured to enable insertion into a human ear; and wherein the thermoelectric element is further configured to utilize a temperature difference between a temperature exterior of the ear and a temperature interior of the ear.

In a further aspect of the present invention, a method for automatically initiating a wireless pairing procedure of a heat powered earphone comprises detecting a level of current from a thermoelectric element of the heat powered earphone; matching the level of current to an in-ear insertion profile; and initiating the wireless pairing procedure in response to the matching; wherein the wireless pairing procedure is one of connecting to a new wireless device and connecting to a previously paired wireless device.

In an additional aspect of the present invention, a method for facilitating a fit adjustment of a heat powered earphone comprises detecting a level of current from a thermoelectric element of the heat powered earphone; matching the level of current to a particular insertion profile; playing, on a speaker of the heat powered earphone, a sound associated with the particular insertion profile.

These and other features, aspects and advantages of the present invention will become better understood with reference to the following drawings, description and claims.

DETAILED DESCRIPTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

Broadly, the present invention provides a heat energy powered earphone system, which utilizes a thermoelectric (TE) module in a novel configuration that capitalizes on human ear physiology to maximize a temperature difference for optimal collection of power. A heat exchanger clip is affixed to the top of an ear and connects to the TE module, advantageously utilizing the property that the top of the ear is one of the coldest parts of the body. The heat exchanger clip may be connected to the TE module via a simple heat pipe. By using the heat exchanger clip, the earphone housing may be manufactured with a compact form factor that enables close insertion to the inner ear. The close proximity of the hot side of the TE module to the hot tissue surfaces of the inner ear further maximizes the temperature difference. Additionally, by providing an open hole in the TE module, audio waves can pass through unobstructed to maintain high quality sound. Audio playback, wireless communications, and power management circuitry may be provided via an external module that is connected via an interconnect cable to the earphone, allowing electronics to be relocated outside of the earphone to avoid the deleterious effects of waste heat.

Methods for interfacing with the heat energy powered earphone are also provided, including a method for automatic pairing with a wireless audio source upon insertion of the earphone, and a method for facilitating fit adjustment of the earphone using audio feedback.

Figure 1:
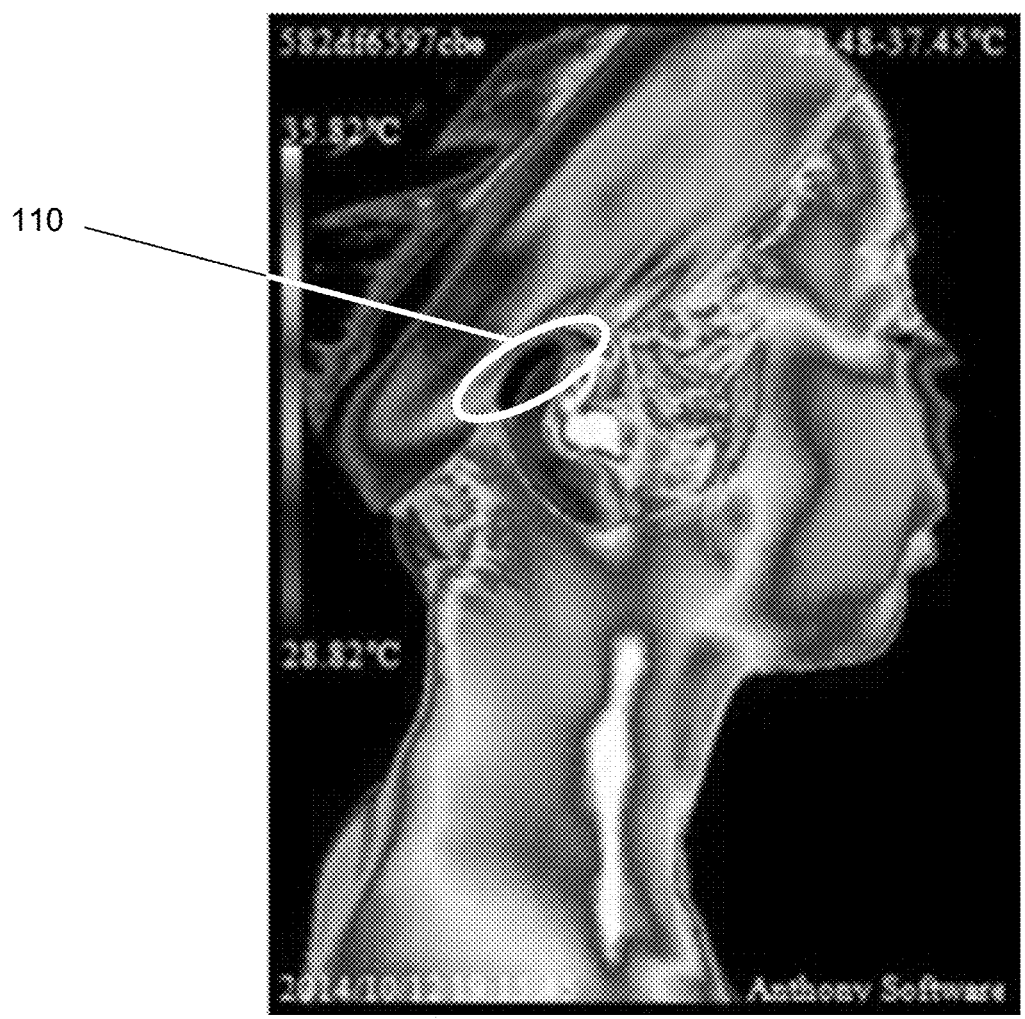
FIG. 1 depicts an exemplary thermal image of a human head.

As discussed above, a heat energy powered earphone of the present disclosure takes advantage of the physiology of the human ear to maximize a temperature difference for optimal power generation. Turning to FIG. 1, FIG. 1 depicts an exemplary thermal image of a human head. As shown in FIG. 1, ear top portion 110 is significantly cooler than other portions of the ear or head, and is often recorded as being close to background ambient temperature. Accordingly, ear top portion 110 becomes an ideal location to place a cold end of a heat exchanger.

Figure 2:
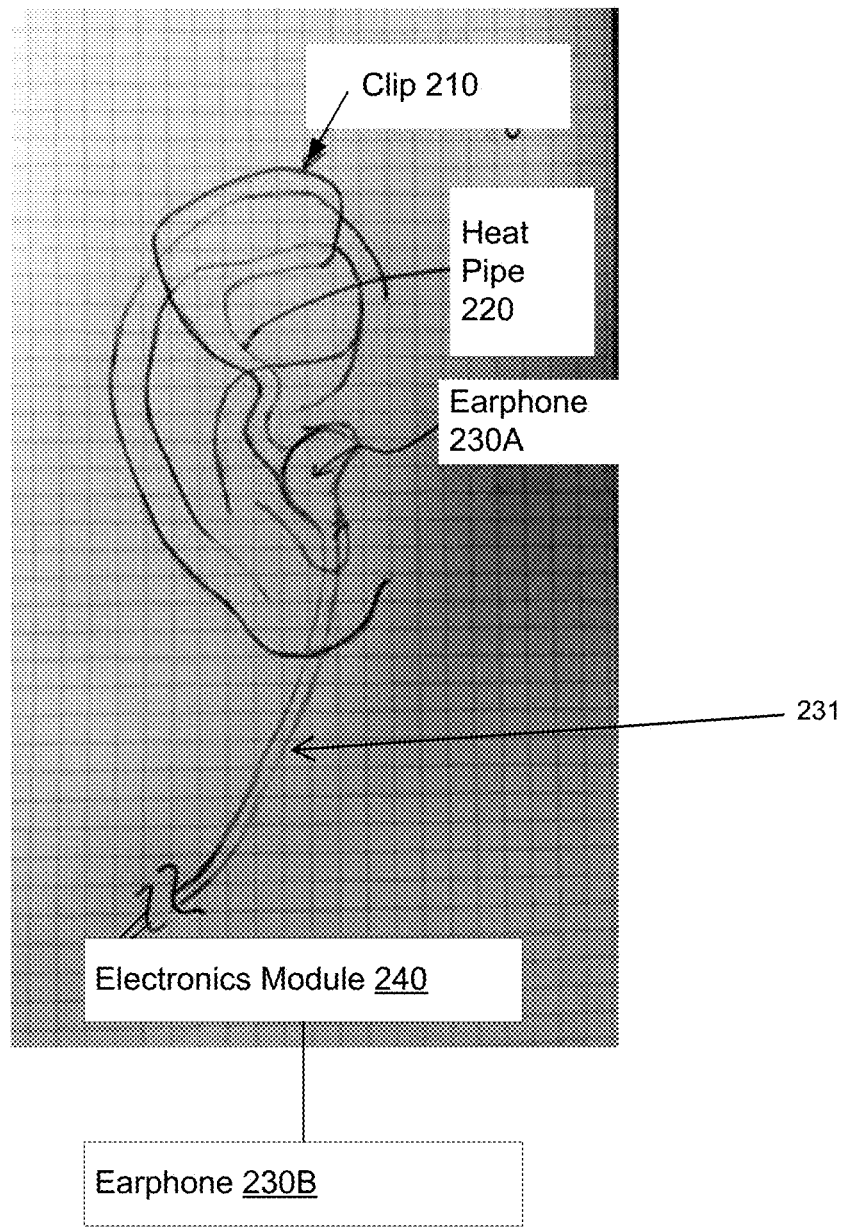
FIG. 2 depicts an illustration of a heat energy powered earphone when inserted into an ear, according to an exemplary embodiment of the present invention.

Turning to FIG. 2, FIG. 2 depicts an illustration of a heat energy powered earphone when inserted into an ear, according to an exemplary embodiment of the present invention. As shown in FIG. 2, earphone 230A is inserted into the ear, and a hot side of a TE module may be included in earphone 230A, as described further below in conjunction with FIG. 3. Earphone 230A is connected to clip 210 via heat pipe 220 which can be constructed with a suitable heat conductive material. As shown in FIG. 2, clip 210 affixes to a top portion of the ear, which is shown to be significantly cooler than other areas of the ear or head, as described above in conjunction with FIG. 1. However, in some situations, for example when the ambient temperature is very cold, clip 210 may instead be affixed to a hat or other piece of clothing to provide increased comfort for the user and further improve the temperature difference. Clip 210 therefore functions as the cold side of a heat exchanger, and the TE module of earphone 230A may generate power from the temperature difference between clip 210 and the hot side of the TE module that is close to the inner ear.

Aside from improving thermoelectric efficiency, clip 210 may also provide physical placement support by clipping on the ear, helping to keep earphone 230A in place and preventing earphone 230A from unintentionally falling out of the ear. This physical support may be especially beneficial for exercise and other activities with strenuous head movements, and may further help to avoid accidental loss or misplacement of the earphones.

Electronics for audio playback, wireless transmission, and power management may be relocated externally to electronics module 240, which may be tethered to earphone 230A via an interconnecting cord 231. Electronics module 240 may include, for example, a Bluetooth Low Energy receiver/transmitter module or other wireless data module, an audio playback module including a digital to analog converter (DAC) and amplifier for playback of audio received from the wireless data module, a power management module for receiving and managing power from the TE module, power storage such as a capacitor or battery, and other hardware or modules. Since electronics module 240 is located externally to earphone 230A, deleterious effects of waste heat from electronics module 240 can be minimized, allowing a TE module of earphone 230A to operate at peak efficiency.

As shown in FIG. 2, electronics module 240 may also connect to an additional earphone 230B for stereo playback to another ear. Earphone 230B may be constructed in a similar fashion as earphone 230A, with a heat pipe similar to heat pipe 220 and a clip similar to clip 210. Since both earphones may be connected to electronics module 240 via a tethered wire, accidental loss or misplacement of the earphones may be avoided.

Figure 3:
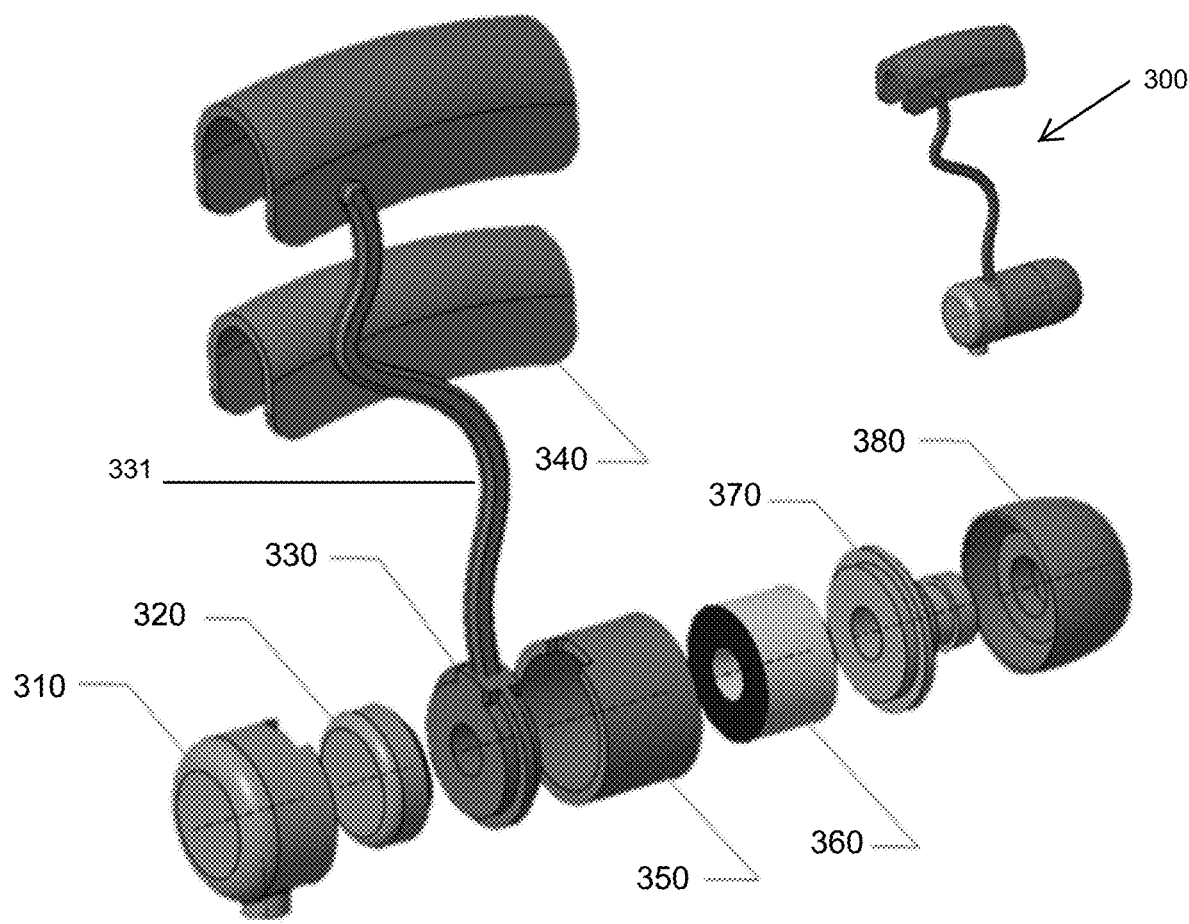
FIG. 3 depicts an exploded view of a heat energy powered earphone, according to an exemplary embodiment of the present invention.

With an overview of earphone 230A now in place, an exemplary construction of earphone 230A may be provided. Turning to FIG. 3, FIG. 3 depicts an exploded view of a heat energy powered earphone system 300, according to an exemplary embodiment of the present invention. Earphone system 300 includes speaker cap 310, speaker 320, cold side heat exchanger 330, foam insert 340, housing 350, thermoelectric element 360, earbud hot side interface 370, and earbud 380.

Speaker cap 310 and housing 350 may form an outer housing for the earphone and may comprise any protective material, such as PC-ABS thermoplastic, to protect speaker 320 and other internal components. Speaker 320 may be a conventional headphone speaker, such as a dynamic driver, balanced armature driver, or other device. Cold side heat exchanger 330 and earbud hot side interface 370 may each comprise any material with high thermal conductivity, such as a copper alloy. Cold side heat exchanger 330 may correspond to clip 210 and heat pipe 220 from FIG. 2. As shown in FIG. 3, a foam insert 340 may be provided underneath cold side heat exchanger 330 for comfort and to protect the user's ear. Foam insert 340 may be constructed of open cell foam or any other suitable material. Thermoelectric element 360 may be constructed of any suitable material for converting a temperature difference into electric current flow, such as bismuth chalcogenides, magnesium group IV compounds, or other materials. Earbud 380 may comprise any suitable material such as but not limited to rubber, foam, or silicone.

As shown in FIG. 3, all of the internal elements after speaker 320, including thermoelectric element 360, are provided with a hollow hole to allow sound waves from speaker 320 to travel unimpeded towards the ear. Accordingly, high quality sound playback can be provided.

The compact construction of the earphone allows earbud hot side interface 370 to be in close proximity to the hot tissue surfaces of the inner ear. On the other end, cold side heat exchanger 330 effectively rests, via heat pipe 331, on top of the ear, one of the coolest locations of the head, or can alternatively clip to a hat or other piece of clothing in the case of cold weather. Waste heat from electrical circuitry is relocated outside of the earphone, as described above in conjunction with FIG. 2. Accordingly, thermoelectric element 360 can operate at peak efficiency with a large temperature difference to provide a steady stream of electrical current to power the devices within electronics module 240.

Moreover, even if the earphone is not inserted to the ear, thermoelectric element 360 may generate electrical power if there is sufficient proximity to a heat source. For example, if the user hangs the earphones from the user's neck, the earphones may naturally touch the skin on the neck, allowing thermoelectric element 360 to generate electrical power even outside of the user's ear.

Thermoelectric element 360 may also be utilized to automatically trigger certain actions of electronics module 240. For example, if thermoelectric element 360 generates a level of current that matches an in-ear insertion profile, then electronics module 240 may automatically begin a wireless pairing process to a new device or connect to a previously paired device via Bluetooth Low Energy or any other suitable wireless protocol. Thus, the earphone may automatically pair to a wireless audio source in response to an insertion of the earphone into the ear.

To ensure a snug fit and high sound quality, speaker 320 may play one or more diagnostic audio tones or sounds depending on a level of current detected from thermoelectric element 360. For example, a buzzing noise or low tone may be played if thermoelectric element 360 generates a level of current that matches a partially inserted in-ear insertion profile, whereas a chime fanfare or high tone may be played if thermoelectric element 360 generates a level of current that matches a fully inserted in-ear insertion profile. In this manner, the user may be guided towards proper insertion of the earphone for best fit and sound quality.

It should be understood, of course, that the foregoing relates to exemplary embodiments of the invention and that modifications may be made without departing from the spirit and scope of the invention as set forth in the following claims.

The invention claimed is:

1. An earphone system, comprising:
a housing containing a speaker and a thermoelectric element, wherein the thermoelectric element includes a hole;
wherein the hole in the thermoelectric element is configured to enable audio waves pass to through unobstructed;
a clip that is connected to the thermoelectric element via a heat pipe; and
an electronics module that utilizes power provided by the thermoelectric element to playback, on the speaker, audio retrieved from a wireless transmission;
wherein the clip, the heat pipe, and the electronics module is external to the housing.

2. The system of claim 1, wherein the housing is configured to enable insertion into a human ear.

3. The system of claim 1, wherein the clip is configured to enable attachment to an exterior part of a human ear.

4. The system of claim 1, further comprising a cold side heat exchanger in the housing.

5. The system of claim 1, further comprising a hot side interface in the housing.

6. An earphone system, comprising:
a speaker; and
a thermoelectric element that provides current to power the speaker;
wherein the thermoelectric element includes a hole;
wherein the hole in the thermoelectric element is configured to enable audio waves pass to through unobstructed;
wherein the speaker and the thermoelectric element are configured to enable insertion into a human ear; and
wherein the thermoelectric element is further configured to utilize a temperature difference between a temperature exterior of the ear and a temperature interior of the ear.

7. The system of claim 6, further comprising a clip in thermal communication with the thermoelectric element, wherein the clip is configured to be disposed external of the ear.

8. The system of claim 6, further comprising a cold side heat exchanger operatively adjacent to the thermoelectric element, wherein the cold side heat exchanger is configured to enable insertion into the ear.

9. The system of claim 6, further comprising a cold side heat exchanger operatively adjacent to the thermoelectric element, wherein the cold side heat exchanger is configured to receive heat externally of the ear.

10. The system of claim 6, further comprising hot side interface operatively adjacent to the thermoelectric element, wherein the hot side interface is configured to enable insertion into the ear.

11. The system of claim 6, further comprising hot side interface operatively adjacent to the thermoelectric element, wherein the hot side interface is configured to receive heat internally of the ear.

12. A method for automatically initiating a wireless pairing procedure of a heat powered earphone, the method comprising:
detecting a level of current from a thermoelectric element of the heat powered earphone;
matching the level of current to an in-ear insertion profile; and
initiating the wireless pairing procedure in response to the matching;
wherein the wireless pairing procedure is one of connecting to a new wireless device and connecting to a previously paired wireless device.

13. The method of claim 12, wherein the thermoelectric element is configured to enable insertion into a human ear.

14. The method of claim 12, wherein the thermoelectric element is configured to utilize a temperature difference between a temperature exterior of the ear and a temperature interior of the ear.

* * * * *